(12) United States Patent
Matsumori et al.

(10) Patent No.: US 10,405,470 B2
(45) Date of Patent: Sep. 3, 2019

(54) PART FEEDING DEVICE AND PART MOUNTING APPARATUS

(71) Applicant: Panasonic Intellectual Property Management Co., Ltd., Osaka (JP)

(72) Inventors: Masashi Matsumori, Osaka (JP); Takashi Nakamura, Osaka (JP); Kazunori Ishikawa, Osaka (JP); Kozo Odawara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 253 days.

(21) Appl. No.: 15/259,661

(22) Filed: Sep. 8, 2016

(65) Prior Publication Data

US 2017/0072710 A1    Mar. 16, 2017

(30) Foreign Application Priority Data

Sep. 15, 2015  (JP) .................................. 2015-181452
Sep. 15, 2015  (JP) .................................. 2015-181453

(51) Int. Cl.
*H05K 13/04*       (2006.01)
*H05K 13/08*       (2006.01)

(52) U.S. Cl.
CPC ..... *H05K 13/0419* (2018.08); *H05K 13/0813* (2018.08)

(58) Field of Classification Search
CPC .............. B65H 5/28; B65H 2701/1942; H05K 13/0417; H05K 3/301

USPC ......................................................... 414/411
See application file for complete search history.

(56) References Cited

U.S. PATENT DOCUMENTS

| | | | |
|---|---|---|---|
| 2003/0219330 A1 | 11/2003 | Lyndaker | |
| 2010/0180435 A1* | 7/2010 | Shin | B65H 37/002 29/740 |
| 2015/0060478 A1* | 3/2015 | Noda | H05K 13/0417 221/73 |
| 2015/0075724 A1* | 3/2015 | Karlsson | H05K 13/02 156/538 |
| 2015/0110588 A1 | 4/2015 | Ohyama | |

FOREIGN PATENT DOCUMENTS

| | | |
|---|---|---|
| JP | 2005-539370 A | 12/2005 |
| JP | 2011-171664 A | 9/2011 |
| JP | 2014-011315 A | 1/2014 |
| JP | 2015-076447 A | 4/2015 |

* cited by examiner

*Primary Examiner* — Ronald P Jarrett
(74) *Attorney, Agent, or Firm* — Pearne & Gordon LLP

(57) ABSTRACT

A part feeding device of the present disclosure includes a main body; a conveyor; and a part detector. At a position further upstream than the part detector, the transporting passage includes a guide surface for guiding the lower surface of the part feeding tape, and a ceiling surface which faces the guide surface and is positioned at a position upwardly apart from the guide surface by the dimension larger than the thickness of the part feeding tape having the maximum thickness to be used in the part feeding device. The transporting passage includes a partial guide surface which supports the lower surface of the part feeding tape, and the partial guide surface includes an approaching portion approaching a ceiling surface in a downstream direction.

24 Claims, 11 Drawing Sheets

PART FEEDING DEVICE AND PART MOUNTING APPARATUS

BACKGROUND

1. Technical Field

The present disclosure relates to a part feeding device for supplying a part to a storage by transporting a part feeding tape with the part held therein and a part mounting apparatus for mounting the fed part on a substrate.

2. Description of the Related Art

As a part feeding device in a part mounting apparatus for mounting a part on a substrate, a tape feeder for supplying the part has been widely used in the form of a part feeding tape with a part held in a pocket-type storage. The part feeding tape is set in a state where the part feeding tapes are wound and stored on reels in the predetermined length, and electronic parts are removed from the part feeding tape, that is transported to a part removing position by the tape feeder, by a mounting head of the part mounting apparatus. When all of the part feeding tapes which are stored on one reel are drawn, a shortage of a part occurs, and a new reel is set to replace the reel for additionally feeding the next part feeding tape.

When replacing the reel, "empty tape discharging" for feeding the preceding part feeding tape after removing the last electronic part or a "cue-up operation" for feeding a first part of the part feeding tape to be subsequently fed to the part removing position is performed. When performing a process associated with such a reel replacement, since it is required to detect whether the part exists or not in the storage of the part feeding tape, the tape feeder having a part detecting sensor for detecting the presence or absence of the parts is conventionally known (for example, refer to PTL 1 and PTL 2). In the related art shown in these patent literature publications, the presence or absence of the part in the storage of the part feeding tape is determined by an optical sensor having a light receiver and a light emitter disposed on a transporting passage of the part feeding tape.

CITATION LIST

Patent Literature

PTL 1: PCT Japanese Translation Patent Publication No. 2005-539370
PTL 2: Japanese Patent Unexamined Publication No. 2015-76447

SUMMARY

According to an aspect of the present disclosure, there is provided a part feeding device which transports a part feeding tape from an upstream side toward a downstream side, and transports the part feeding tape which stores a part in a storage to a part removing position to feed the part stored in the storage to a part mounting apparatus. The part feeding device includes a main body in which a transporting passage for guiding the part feeding tape to the part removing position is provided; a conveyor for transporting the part feeding tape in the transporting passage toward the part removing position to position the storage on the part removing position; and a part detector for detecting the part stored in the storage in the transporting passage located upstream of the part removing position. At a position further upstream than the part detector, the transporting passage includes a guide surface for guiding the lower surface of the part feeding tape, and a ceiling surface which faces the guide surface and is positioned at a position upwardly apart from the guide surface by the dimension larger than the thickness of the part feeding tape having the maximum thickness to be used in the part feeding device. The transporting passage includes a partial guide surface which supports the lower surface of at least one side portion of the part feeding tape at a position further upstream than the detection position of the part by the part detector, and the partial guide surface includes an approaching portion approaching a ceiling surface toward the downstream side.

According to another aspect of the present disclosure, there is provided a part mounting apparatus which transports a part feeding tape from an upstream side toward a downstream side, transports the part feeding tape which stores a part in a storage to a part removing position, and removes the part from the storage positioned on the part removing position to mount the removed part on a substrate. The part mounting apparatus includes a main body portion in which a transporting passage for guiding the part feeding tape to the part removing position is provided; a conveyor for transporting the part feeding tape in the transporting passage toward the part removing position to position the storage to the part removing position; a part detector for detecting the part stored in the storage in transporting passage at a position further upstream than the part removing position; and a mounting head for mounting the part, which is removed from the storage that is positioned on the part removing position, on the substrate. At a position further upstream than the part detector, the transporting passage includes a guide surface for guiding the lower surface of the part feeding tape, and a ceiling surface which faces the guide surface and is positioned at a position upwardly apart from the guide surface by the dimension larger than the thickness of the part feeding tape having the maximum thickness to be used in the part feeding device. The transporting passage includes a partial guide surface which supports the lower surface of at least one side portion of the part feeding tape at a position further upstream than the detection position of the part by the part detector, and the partial guide surface includes an approaching portion approaching a ceiling surface toward the downstream side.

According to still another aspect of the present disclosure, there is provided a part feeding device which transports a part feeding tape from an upstream side toward a downstream side, and transports the part feeding tape which stores a part in a storage to a part removing position to feed the part stored in the storage to a part mounting apparatus. The part feeding device includes a part detecting sensor having a main body portion in which a transporting passage for guiding the part feeding tape to the part removing position is provided, a conveyor for transporting the part feeding tape in the transporting passage toward the part removing position to position the storage on the part removing position, and a part detector for detecting the part stored in the storage in the transporting passage a position further upstream than the part removing position. At a position further upstream than the part detector, the transporting passage includes a guide surface for guiding the lower surface of the part feeding tape, and a ceiling surface which faces the guide surface and is positioned at a position upwardly apart from the guide surface by the dimension larger than the thickness of the part feeding tape having the maximum thickness to be used in the part feeding device. The part detecting sensor configures a part of the transporting passage, and includes a passage which is provided with an inlet at a position further upstream than the transporting passage and an outlet at a position further downstream than the transporting passage, an upper portion which configures a ceiling of the passage, and a partial guide surface which supports the lower surface of at least one side portion of the part feeding tape in the passage. The partial guide surface includes an approaching portion approaching the upper portion in a downstream direction.

According to sill another aspect of the present disclosure, there is provided a part mounting apparatus which transports a part feeding tape from an upstream side toward a downstream side, transports the part feeding tape which stores a part in a storage to a part removing position, and removes the part from the storage positioned on the part removing position to mount the removed part on a substrate. The part mounting apparatus includes a main body portion in which a transporting passage for guiding the part feeding tape to the part removing position is provided; a conveyor for transporting the part feeding tape in the transporting passage toward the part removing position to position the storage to the part removing position; a part detecting sensor having a part detector for detecting the part stored in the storage in the transporting passage at a position further upstream than the part removing position; and a mounting head for mounting the part, which is removed from the storage that is positioned on the part removing position, on the substrate. At a position further upstream than the part detector, the transporting passage includes a guide surface for guiding the lower surface of the part feeding tape, and a ceiling surface which faces the guide surface and is positioned at a position upwardly apart from the guide surface by the dimension larger than the thickness of the part feeding tape having the maximum thickness to be used in the part mounting apparatus. The part detecting sensor configures a part of the transporting passage, and includes a passage which is provided with an inlet at a position further upstream than the transporting passage and an outlet at a position further downstream than the transporting passage, an upper portion which configures a ceiling of the passage, and a partial guide surface which supports the lower surface of at least one side portion of the part feeding tape in the passage. The partial guide surface includes an approaching portion approaching the upper portion in a downstream direction.

DETAILED DESCRIPTION

Prior to descriptions of an exemplary embodiment, problems in a related art apparatus will be briefly explained.

In the conventional art detecting the presence or absence by an optical sensor including the above-mentioned prior art example, there are the following drawbacks. That is, since there are various types parts or parts having a various size to be fed by the tape feeder, and also regarding a tape to be used as a carrier of parts in the part feeding tape, there are various types of tapes such as a paper tape for a small-sized part or an embossed tape for storing a large-sized part in an embossed portion. Therefore, the versatility available for the various types of the part feeding tapes as a feeding target is required for the tape feeder.

When detecting the presence or absence of the parts in the storage using an optical sensor for such a various types of parts or the parts having different sizes, regarding part detecting accuracy, the detecting causes the following problems. That is, in a case where the various types of the part feeding tape are set as a target, since the difference between the thicknesses of the part feeding tapes is large depending on the types of the parts, a distance between the light emitter and the light receiver in the optical sensor has to set the part feeding tape having the maximum thickness such as the embossed tape as a target. Therefore, in a case where a thin-type part feeding tape storing a minute part is set as a target, the position of the part feeding tape in the optical sensor in a thickness direction is not stable, and as a result, there is a problem in that the part detecting accuracy becomes unstable.

Exemplary Embodiment

Figure 1:
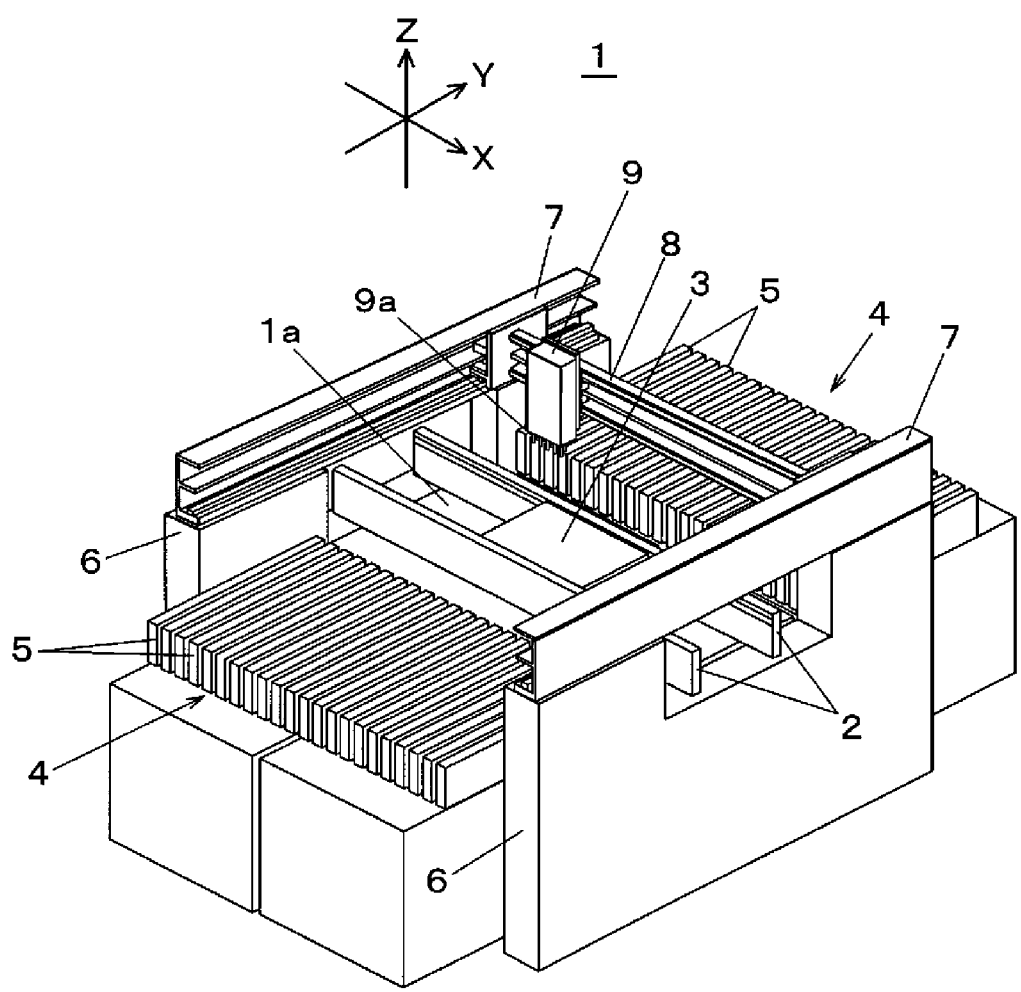
FIG. 1 is a perspective view of a part mounting apparatus using a part feeding device according to an exemplary embodiment of the present disclosure.

Next, an exemplary embodiment of the present disclosure will be described with reference to the drawings. First, a configuration and a function of part mounting apparatus 1 will be described with reference to FIG. 1. In FIG. 1, substrate transporting mechanism 2 is disposed on the upper surface of base mounting portion 1*a* in an X-direction (substrate transporting direction). Substrate transporting mechanism 2 receives substrate 3 to be subjected to a part mounting work transports the substrate to a mounting work position in part mounting apparatus 1 and positions from an upstream-side apparatus (not shown) and holds the substrate. Component feeders 4 are disposed on the both sides of substrate transporting mechanisms 2, and in component feeders 4, a plurality of tape feeders 5 are provided respectively. Tape feeder 5 is a part feeding device for feeding a part to be mounted on part mounting apparatus 1 has a function of transporting part feeding tape 11 storing parts P in storages 20*a* shown in FIG. 11 to a part removing position (refer to part removing position 12 shown in FIGS. 2A and 2B) by mounting head 9 to be described below.

Y-axial transfer tables 7 are arranged in a Y-direction, respectively on the upper surface of a pair of frame members 6 disposed on the both end portion of part mounting apparatus 1 in an X-direction. X-axial transfer tables 8 are disposed between Y-axial transfer tables 7 and are moveable in the Y-direction, and mounting head 9 is mounted on X-axial transfer table 8 such that mounting head 9 is moveable in the X-direction. Mounting head 9 has a plurality of adsorption nozzles 9*a* on the lower surface, and mounting head 9 moves in XY-directions by driving Y-axial transfer table 7 and X-axial transfer table 8. Therefore, mounting head 9 removes part P from storage 20*a* positioned on part removing position 12 of tape feeder 5 to mounting portion part P on substrate 3.

Figure 11:
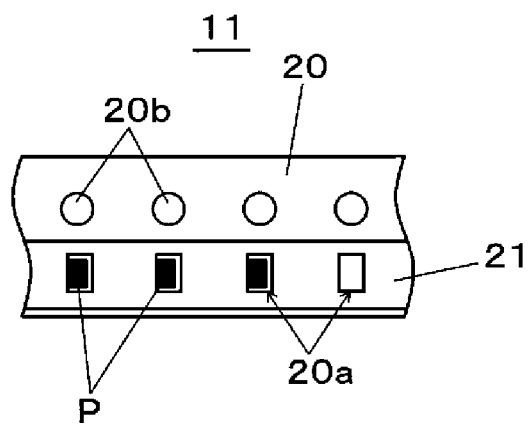
FIG. 11 is a plan view of the part feeding tape to be used in the part feeding device according to the exemplary embodiment of the present disclosure.

That is, part mounting apparatus 1 has a function of transporting part feeding tape 11 storing part P in storage 20*a* to part removing position 12, removing part P from storage 20*a* of part removing position 12, and mounting removed part P on substrate 3 positioned on substrate transporting mechanism 2. In FIG. 11, part feeding tape 11 mainly includes base tape 20 having storage 20*a* for storing part P and feed hole 20*b* for feeding part feeding tape 11. In base tape 20, cover tape 21 is adhered to an upper side and lower tape 21*a* is adhered to a lower surface, in a range where storages 20*a* are formed (refer to FIGS. 7A and 7B).

Figure 2A:
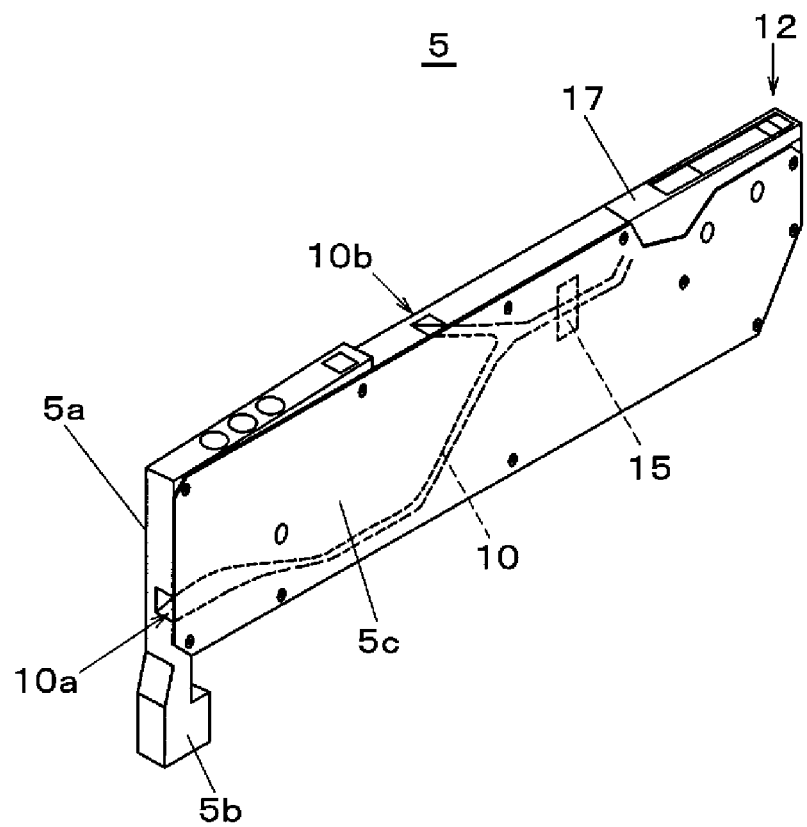
FIG. 2A is an explanatory view of the part feeding device according to the exemplary embodiment of the present disclosure.
Figure 2B:
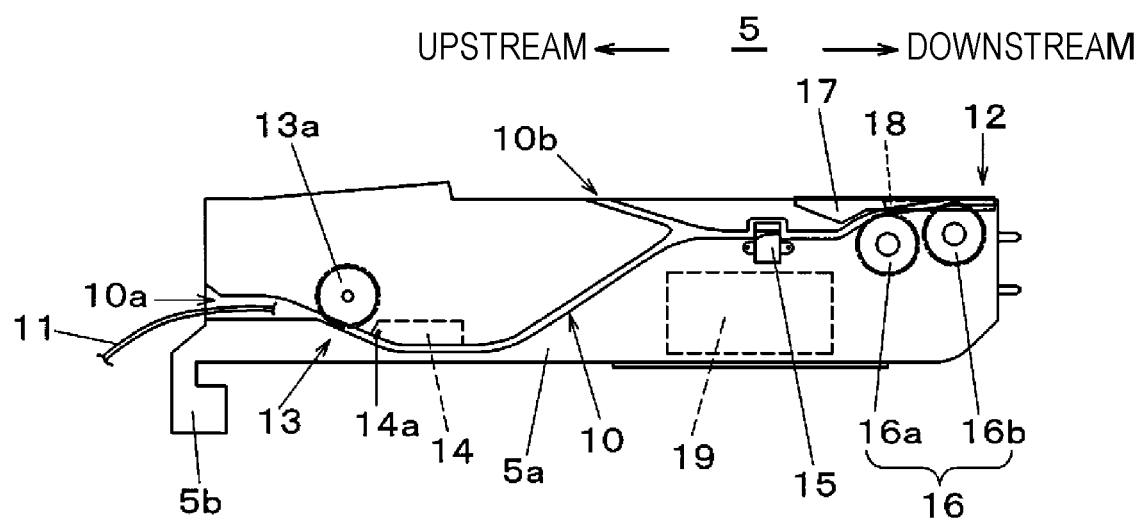
FIG. 2B is an explanatory view of the part feeding device according to the exemplary embodiment of the present disclosure.

Next, the configuration and the function of tape feeder 5 will be described with reference to FIGS. 2A and 2B. In FIG. 2A, tape feeder 5 includes main body portion 5*a*, mounting portion 5*b* provided on and projected downward from the lower surface of main body portion 5*a*, and cover 5*c* for covering the side surface of main body portion 5*a*. FIG. 2B conceptually illustrates a front view of tape feeder 5 removing cover 5*c*. In a state where tape feeder 5 is mounted with the lower surface of main body portion 5*a* applied along a feeder base (not shown in the figure) of part mounting apparatus 1, tape feeder 5 is fixed and mounted by mounting portion 5*b*. Feeder controller 19 housed in tape feeder 5 to control tape feeding is connected to a device controller (not shown in the figure) of part mounting apparatus 1.

Transporting passage 10 which is used to guide part feeding tape 11 taken into tape feeder 5 is provided in main body portion 5*a*. Transporting passage 10 is provided extending from insertion port 10*a*, which opens at the end of the upstream side (left side in FIG. 1) of tape feeder 5 in a tape feeding direction and inserts part feeding tape 11, to part removing position 12 by mounting head 9. Transporting passage 10 forms a long tunnel-like thin and long space formed by a groove formed in main body portion 5*a* and cover 5*c* for covering the groove. At the upstream side which closes to insertion port 10*a* in transporting passage 10, feeder 13 having feed sprocket 13*a* to be rotationally driven by a feed motor (not shown) is disposed.

Feeder 13 has a function of transporting part feeding tape 11 inserted from insertion port 10*a* to transporting passage 10 toward part removing position 12. When inserting part feeding tape 11 from insertion port 10*a* to transporting passage 10, feed hole 20*b* is engaged with feed sprocket 13*a*, and when detecting the engagement, the feed motor is driven, and part feeding tape 11 feeds the tape to the downstream side.

At the downstream side of feeder 13 in transporting passage 10, tape standby operation mechanism 14 having tape stopper 14*a* is disposed. In a state where tape feeding of part feeding tape 11, which is sent first and to be subjected to part removing (hereinafter, referred to as a "preceding tape"), is continuously performed, tape stopper 14*a* has a function configured to stop the tape feeding by contacting the tip end portion of next part feeding tape 11 (hereinafter, referred to as a "following tape") which is additionally inserted from insertion port 10*a*. Tape standby operation mechanism 14 has a sensor for detecting the presence or absence of the following tape which is stopped by contacting tape stopper 14*a*. By controlling tape stopper 14*a* based on a detecting result by the sensor, appropriate tape feeding of the following tape is performed in accordance with the state of the preceding tape.

At the upstream side immediately under part removing position 12 in transporting passage 10, conveyor 16 having two sprockets of first sprocket 16*a* and second sprocket 16*b*, which are driven by the same driving source, is disposed. By performing a pitch feeding of part feeding tape 11 engaged with first sprocket 16*a* and second sprocket 16*b*, conveyor 16 positions storage 20*a* of part feeding tape 11 transported toward part removing position 12 to part removing position 12.

The upper portion of conveyor 16 is covered with cover member 17, and cover tape processor 18 is disposed on the rear surface of cover member 17. Cover tape 21 is separated from part feeding tape 11 to be fed for feeding tape by conveyor 16, by using a stripping claw of cover tape processor 18 at the upstream side of part removing position 12, or cover tape 21 is cut off by using a cutting blade, and part P stored in storage 20*a* becomes an exposed state. Therefore, part P can be picked up from storage 20*a* fed to part removing position 12 by mounting head 9 which is included in the part mounting apparatus.

That is, part mounting apparatus 1 inserts part feeding tape 11 which stores part P in storage 20*a* through insertion port 10*a* to transport inserted part feeding tape 11 in a transporting direction, removes part P stored in storage 20*a* in part removing position 12, and mounts removed part P on substrate 3. Tape feeder 5 in part mounting apparatus 1 serves as a part feeding device for transporting part feeding tape 11, which stores part P in storage 20*a*, to part removing position 12, and feeding part P stored in storage 20*a* in part removing position 12 to part mounting apparatus 1.

Transporting passage 10 between feeder 13 which is located downstream from insertion port 10a and part removing position 12, that is, in transporting passage 10 located upstream from part removing position 12 and downstream from feeder 13, part detecting sensor 15 having part detector 50 (refer to FIGS. 6A and 6B) for detecting part P stored in storage 20a is disposed. Part detecting sensor 15 is electrically connected to feeder controller 19 which is disposed inside of main body portion 5a. Therefore, operating of part detecting sensor 15 and receiving of part detecting signals by part detecting sensor 15 are performed.

Manual feed port 10b which is opened in the upper surface of main body portion 5a at the upstream side of part detecting sensor 15 is provided on transporting passage 10. Regarding the feeding of part feeding tape 11 to tape feeder 5, in a case where part feeding tape 11 is fed in a manual feed manner, manual feed port 10b is used instead of insertion from insertion port 10a.

Next, a shape and a configuration of part detecting sensor 15 will be described with reference FIGS. 3 to 5. As a detection principle of part P by part detector 50 (refer to FIGS. 6A and 6B) to be used in part detecting sensor 15, various principles can be selected and used. However, in the present exemplary embodiment, an example by a light transmissive method will be described. The light transmissive method in which part feeding tape 11 is irradiated with light from the light emitter, and the light from the light emitter that has passed through part feeding tape 11 is received in the light receiver to determine the presence or absence of part P in part feeding tape 11.

Figure 3:
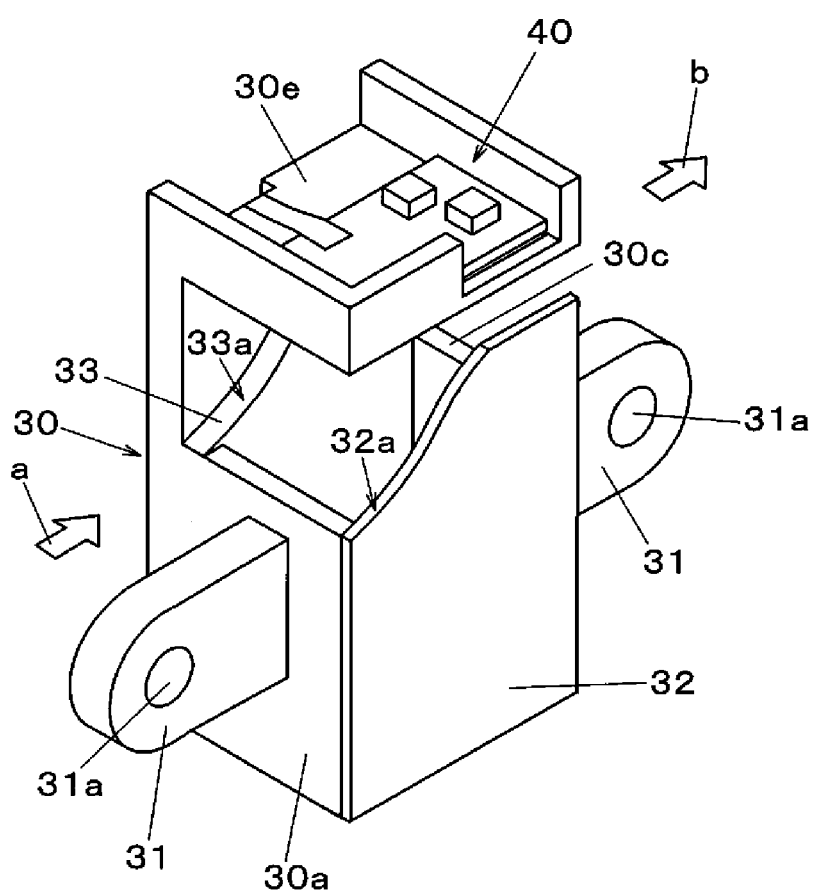
FIG. 3 is a perspective view showing an outline of a part detecting sensor to be used in the part feeding device according to the exemplary embodiment of the present disclosure.

As shown in FIG. 3, part detecting sensor 15 has sensor main body 30 having a substantially rectangular parallelepiped shape that is hollow which includes side surfaces 30a, 30c, and 30d, guide side plate 32, bottom portion 30b (refer to FIG. 4), and upper portion 30e. In the both side surfaces 30a and 30c in a tape traveling direction, attaching part 31, in which screw tightening hole 31a for attaching and fixing is formed, is fixed. When part detecting sensor 15 is fixed and mounted on main body portion 5a, attaching part 31 is screwed by passing a bolt for attaching to screw tightening hole 31a (refer to FIG. 6A).

Inlet 30i for entering (arrow a) part feeding tape 11 (refer to FIG. 11) to be detected, which opens on the side surface 30a at the upstream side, is provided, and outlet 30j for leaving (arrow b) part feeding tape 11, which opens on side surface 30c at the downstream side, is provided. Partial guide surfaces 33a and 32a for guiding a progress of part feeding tape 11 are provided on the upper surfaces of guide 33 and guide side plate 32, which are provided in an inner surface of side surface 30d, respectively. Light receiver 40 for part detecting is disposed on the upper surface of upper portion 30e.

Figure 4:
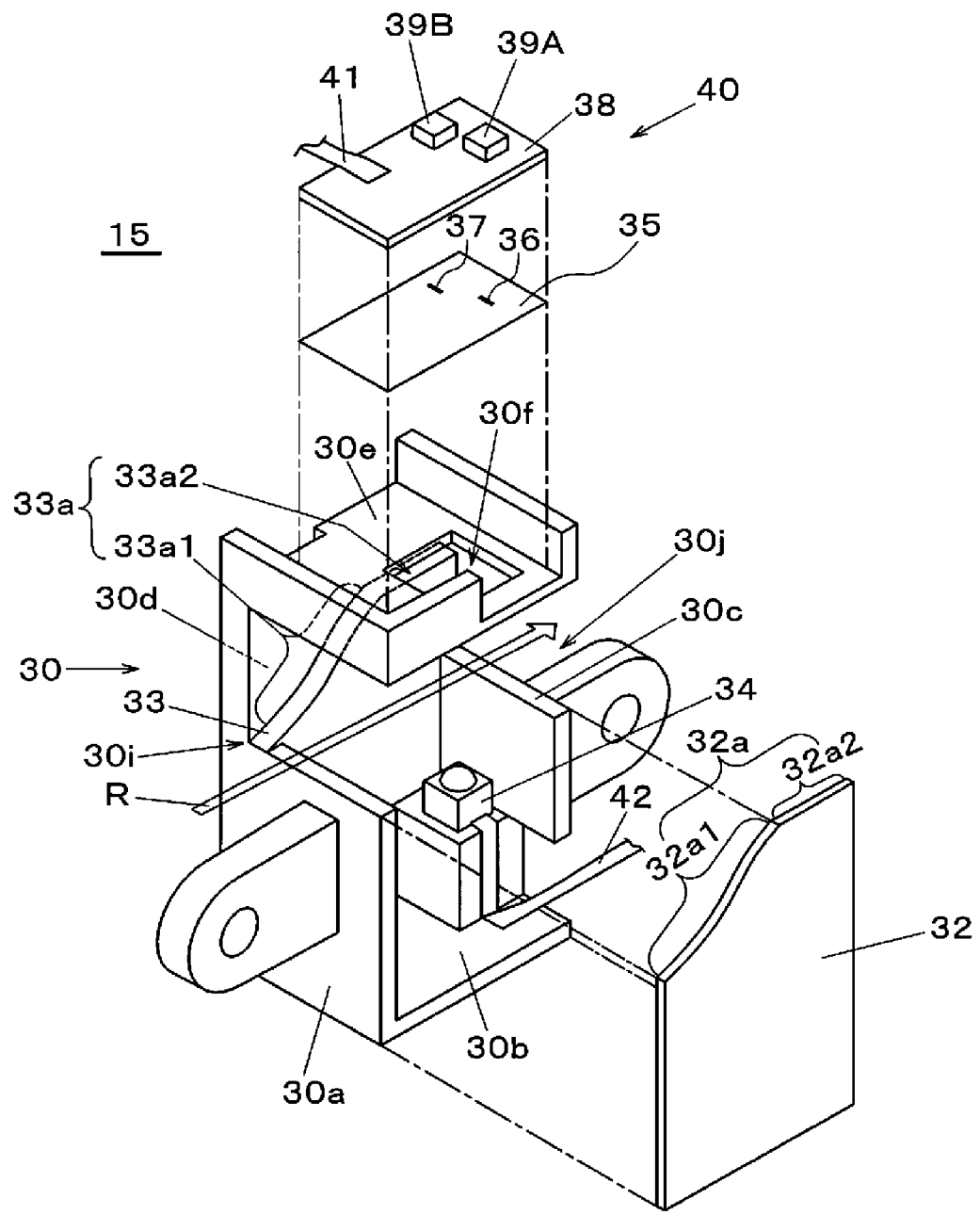
FIG. 4 is an explanatory view of a configuration of the part detecting sensor to be used in the part feeding device according to the exemplary embodiment of the present disclosure.

As shown in FIG. 4, light receiver 40 is formed of sensor substrate 38 in which light receiving sensors 39A and 39B are mounted on the upper surface and shielding member 35 to be mounded on the lower surface side of sensor substrate 38. Wiring 41 for signal transmitting is led to light receiver 40. In shielding member 35, slits 36 and 37 are formed according to the positions of light receiving sensors 39A and 39B. Here, part P in storage 20a is to be detected by light receiving sensor 39A and slit 36, and feed hole 20b in part feeding tape 11 is to be detected by light receiving sensor 39B and slit 37. The reason why feed hole 20b is to be detected, the position detection of storage 20a in which part P to be exists is certainly performed that is an original detection purpose.

Rectangular openings 30f are formed in upper portion 30e according to the positions of slits 36 and 37. Light emitter 34 radiating light for part detecting to part feeding tape 11 is disposed on the lower side of opening 30f so that light emitting surface face upward. Wiring 42 for transmitting electrical power for light emitting is led to light emitter 34. In a state where light receiver 40 in combination with sensor substrate 38 and shielding member 35 is disposed on upper portion 30e, opening 30f is disposed at the top surface of light emitter 34. Therefore, detecting light beams emitted from light emitter 34 are received in light receiving sensors 39A and 39B through slits 36 and 37 (refer to FIG. 6B).

That is, light receiving sensors 39A and 39B receives the light from light emitter 34 that has passed through part feeding tape 11. Shielding member 35 is disposed on a position that overlaps the position through which storage 20a to be detected that is disposed between light emitter 34 and part feeding tape 11 is passed, and includes slits 36 and 37 as an opening through which the light from light emitter 34, that has passed through part feeding tape 11, is passed.

Partial guide surfaces 32a and 33a for tape guiding which are provided on the upper surfaces of guide side plate 32 and guide 33 is configured of slope-like slope guide surfaces 32a1 and 33a1 and horizontal-like horizontal guide surfaces 32a2 and 33a2. A space, to which inlet 30i formed in side surface 30a of sensor main body 30 and outlet 30j formed on 30c are penetrated, becomes passage R for transporting part feeding tape 11 by communicating with transporting passage 10. That is, part detecting sensor 15 includes passage R having inlet 30i at the upstream side and outlet 30j at the downstream side which constitute a part of transporting passage 10 and upper portion 30e forming a ceiling of passage R. As described in detailed in FIGS. 6A and 6B, the part detecting sensor has a configuration having partial guide surfaces 32a and 33a for supporting the lower surface of at least one side portion of part feeding tape 11 in passage R.

Figure 5:
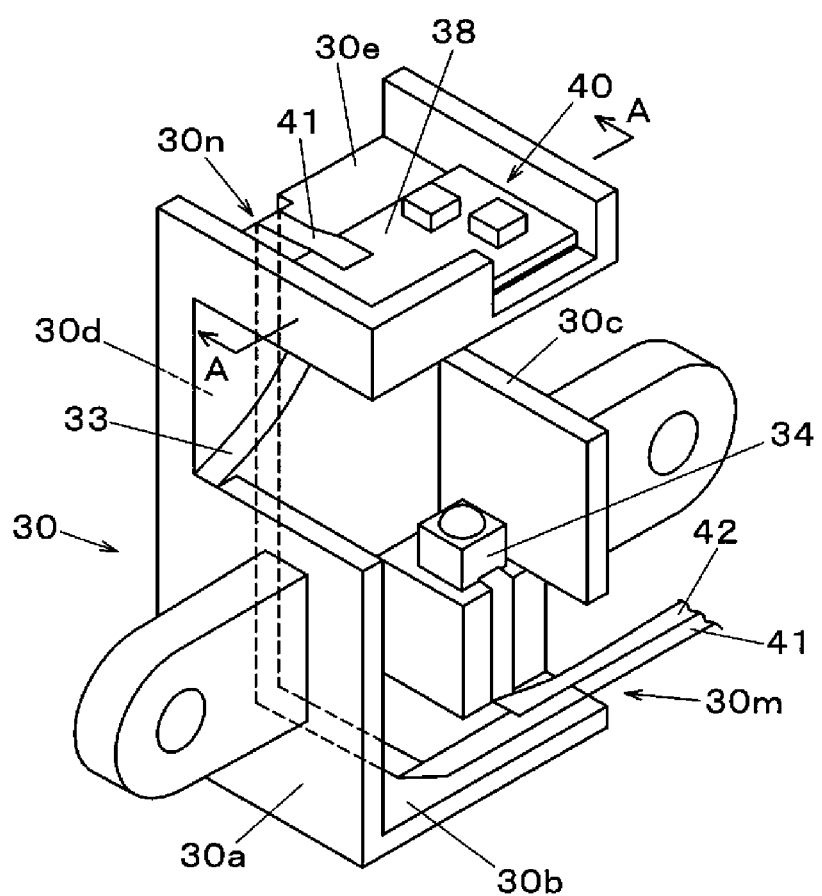
FIG. 5 is a perspective view of the part detecting sensor to be used in the part feeding device according to the exemplary embodiment of the present disclosure.

FIG. 5 shows an outline of a state where guide side plate 32 is not mounted in a state where light receiver 40 having the above-described configuration is mounted on upper portion 30e and assembled to part detecting sensor 15. In this state, wiring 41, which is led in sensor substrate 38, is directed to the upper surface of bottom portion 30b by way of notch 30n formed in side surface 30d. Feeder controller 19 (refer to FIG. 2B) is connected to bottom portion 30b through wiring 42 led to light emitter 34 to be disposed on bottom portion 30b and notch 30m formed on side surface 30c. In the present exemplary embodiment, a configuration of bottom portion 30b, on which guide 33 and light emitter 34 provided on upper portion 30e and guide side plate 32 are disposed, is designed such that the configuration is to be integrally molded by resin molding. The manufacturing of sensor main body 30 of the part detecting sensor 15 can be performed in a simple manner and with a low cost.

Figure 6A:
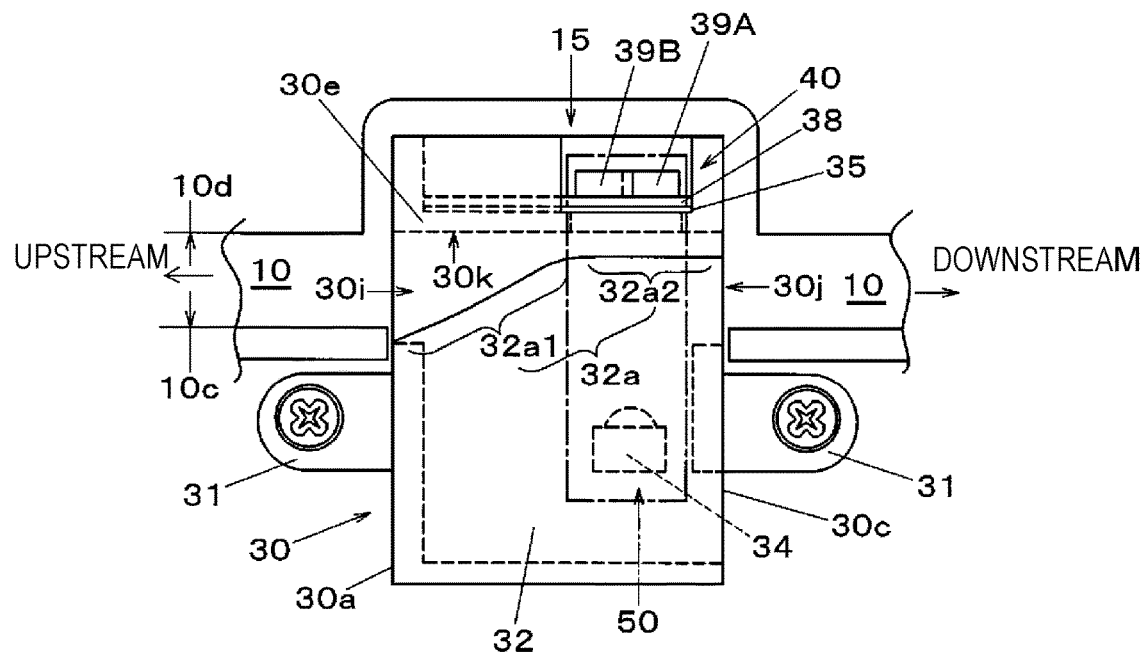
FIG. 6A is an explanatory view of a detailed construction of the part detecting sensor to be used in the part feeding device according to the exemplary embodiment of the present disclosure.
Figure 6B:
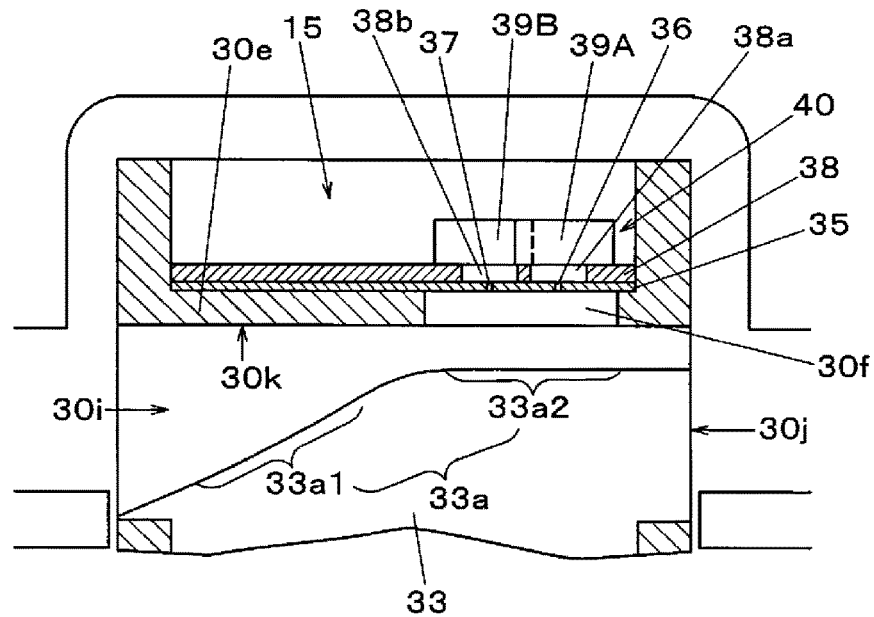
FIG. 6B is an explanatory view of a detailed construction of the part detecting sensor to be used in the part feeding device according to the exemplary embodiment of the present disclosure.

Next, the detailed structure of part detecting sensor 15 will be described by reference with FIGS. 6A and 6B. FIG. 6A shows a side surface of part detecting sensor 15 of a state where part detecting sensor 15 is bolted to main body portion 5a (refer to FIG. 2B) of tape feeder 5 via attaching part 31. Guide side plate 32 (refer to FIGS. 3 and 4) is attached to the side surface. In addition, FIG. 6B shows a cross-section (cross section taken along line A-A in FIG. 5) of the upper part from transporting passage 10 in a state where part detecting sensor 15 is attached to main body portion 5a. The light emitted from light emitter 34 in part detector 50 passes through opening 30f, and is received to light receiving sensors 39A and 39B via slits 36 and 37.

In FIG. 6A, light emitter 34 included in a broken line frame and light receiver 40 configures part detector 50 for detecting part P stored in storage 20a, in transporting passage 10. In a state where part detecting sensor 15 in main body portion 5a is fixed and disposed so as to cross transporting passage 10, transporting passage 10 at the upstream side is communicated with inlet 30i of sensor main body 30. Therefore, a series of transporting passages 10 for transporting part feeding tape 11 are formed in main body portion 5a including passage R shown in FIG. 4.

On transporting passages 10 described above, at the upstream portion of part detecting sensor 15 where at least part detector 50 is provided, guide surface 10c for guiding the lower surface of part feeding tape 11 and ceiling surface 10d which faces guide surface 10c and is positioned at a position upwardly apart from guide surface 10c by the dimension larger than the thickness of part feeding tape 11 (refer to part feeding tape 11A shown in FIG. 8A) having a maximum thickness used from guide surface 10c to tape feeder 5 are provided.

At the upstream portion adjacent to the upstream side than the detection position of the part by part detector 50 in the internal portion of part detecting sensor 15, partial guide surfaces 32a and 33a for supporting and guiding the lower surface of the both side portion of part feeding tape 11 are provided. A part of partial guide surfaces 32a and 33a is an approach portion gradually approaching ceiling surface 30k of the lower surface of upper portion 30e toward a downstream side. As shown in slope guide surfaces 32a1 and 33a1, a portion configuring of the approach portion includes a slope raising toward the downstream side. Part detector 50 detects part P stored in storage 20a of part feeding tape 11 which approaches to ceiling surface 30k by passing through slope guide surfaces 32a1 and 33a1 that are approaching portions.

In the exemplary embodiment as described above, regarding the detection of the presence or absence of part P in storage 20a of part feeding tape 11 by part detector 50 included in part detecting sensor 15, an example, in which transmitted light detecting for detecting light that has passed through part feeding tape 11 radiated from light emitter 34 by light receiving sensor 39A, is performed, is described. In addition to the example, other various detecting methods can be used.

For example, detecting the presence or absence of part P in storage 20a may be performed by detecting the reflected light from part P in storage 20a instead of receiving the light from light emitter 34 that has passed through storage 20a of part feeding tape 11. In this case, a projector for radiating the light is provided on upper portion 30e, and the projector is disposed such that the light in which the irradiation light is reflected from part P in storage 20a can be received in the light receiver.

Furthermore, as a detecting element in part detector 50, a magnetic sensor can be used. That is, when part P in storage 20a has a metallic portion and has characteristics of reacting to a magnetic field, the magnetic sensor id disposed on a position corresponding to opening 30f of upper portion 30e. When storage 20a passing through slope guide surfaces 32a1 and 33a1 approaches the magnetic sensor, the presence of part P in storage 20a is detected by detecting signals which is issued when part P having the metallic position in storage 20a approaches the magnetic sensor.

That is, as part detector 50, a detector using the magnetic sensor for detecting changes in the magnetic field can be adopted, or a detector using an optical sensor for receiving light from light emitter 34 that has passed through the part feeding tape 11 or light reflected from part P which is radiated from light emitter 34, by light receiving sensor 39A may be used. In a case of adopting such a method, the magnetic sensor or light receiving sensor 39A is disposed on upper portion 30e side that is ceiling surface 30k.

In the part detecting sensor 15 shown in the exemplary embodiment, partial guide surfaces 32a and 33a support the both side portion of part feeding tape 11. However, only partial guide surface 33a without guide side plate 32 may support the lower surface of the side portion of one side of part feeding tape 11. That is, part detecting sensor 15 according to the present exemplary embodiment has partial guide surfaces 32a and 33a which support and guide the lower surface of at least one side portion of part feeding tape 11. Part feeding tape 11 that is a target in the present exemplary embodiment has a plurality of feed holes 20b for tape transporting (refer to FIG. 11) at a constant pitch. Partial guide surfaces 32a and 33a are provided to guide the side portion of part feeding tape 11 having at least plurality of feed hole 20b, that is, the side portion corresponding to partial guide surface 33a which is fixed to the inner side of side surface 30d (FIGS. 7A, 7B, 8A, and 8B).

Next, an example of a part detection targeting of part feeding tape 11 made of a paper tape having a small thickness will be described by reference with FIGS. 7A and 7B. As shown by the cross-section in FIG. 7B, part feeding tape 11 has a configuration in which cover tape 21 and bottom tape 21a are adhered to the lower surface and the lower surface of base tape 20 in which storage 20a and feed hole 20b are formed, respectively. Small-sized part P is stored in storage 20a.

Figure 7A:
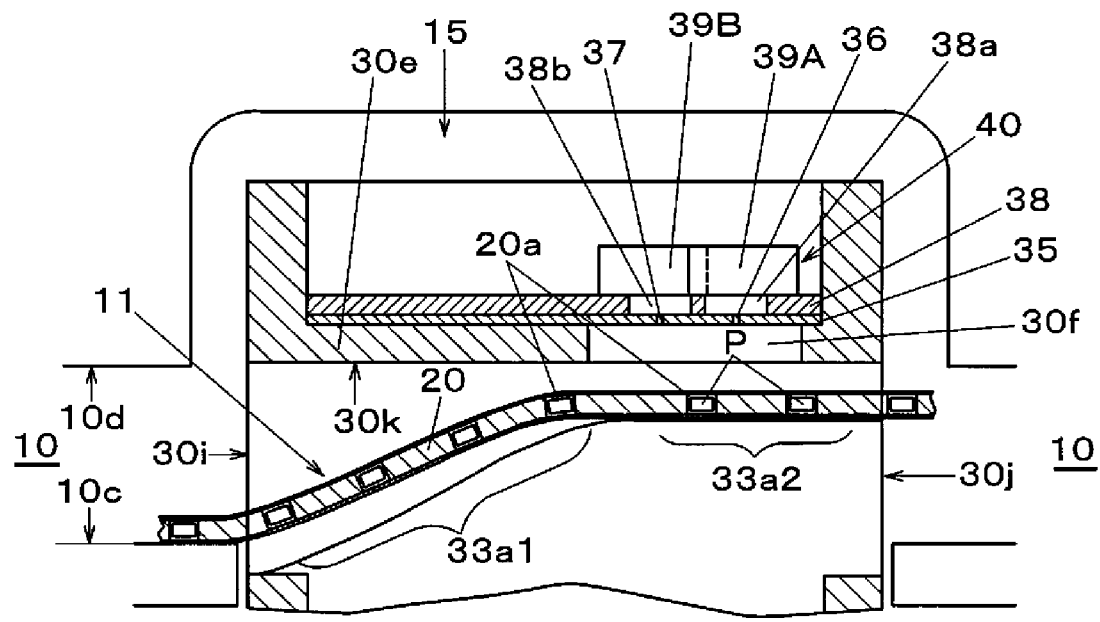
FIG. 7A is an explanatory view of part detection targeting of a paper-made part feeding tape by the part detecting sensor to be used in the part feeding device according to the exemplary embodiment of the present disclosure.
Figure 7B:
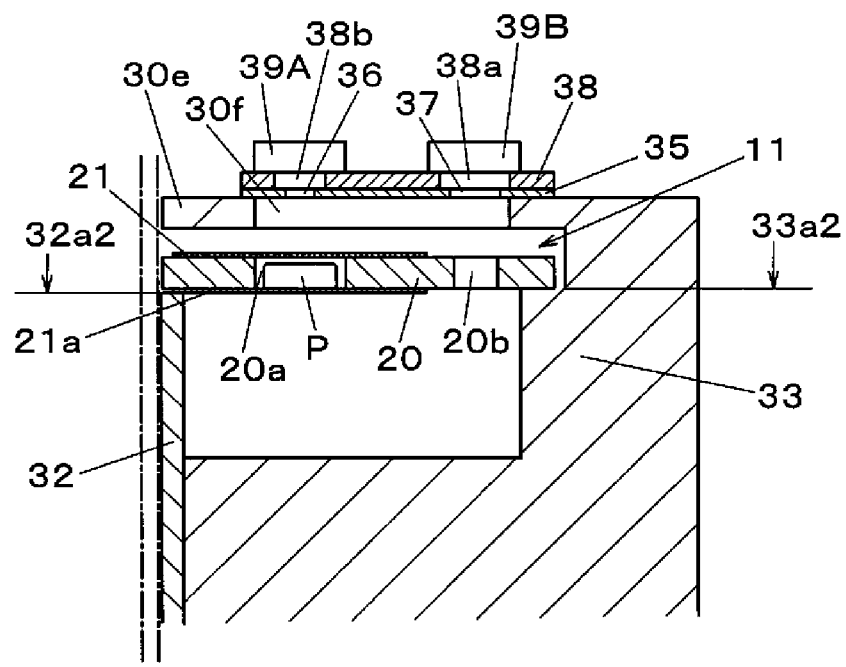
FIG. 7B is an explanatory view of part detection targeting of the paper-made part feeding tape by the part detecting sensor to be used in the part feeding device according to the exemplary embodiment of the present disclosure.

As shown in FIG. 7A, part feeding tape 11, which is transported along guide surface 10c of transporting passage 10 at the upstream side, enters into part detecting sensor 15 from inlet 30i, and as shown in FIG. 7B, the part feeding tape 11 is transported in a state where the lower surface of the both side portions is supported by slope guide surfaces 32a1 and 33a1 and horizontal guide surfaces 32a2 and 32a2. When storage 20a to be inspected is reached to an inspection position by part detector 50 (FIG. 6A), the light that has passed through storage 20a and is emitted from light emitter 34 is received by light receiving sensor 39A via slit 36 to detect the presence or absence part P in storage 20a.

Therefore, even in a case where a thin tape having a small thickness such as part feeding tape 11 is set as a target, part feeding tape 11 guided into part detecting sensor 15 is transported such the slope guide surfaces 33a1 and 33a2 in a form having the above-described approach portion support the lower surface of the part feeding tape 11. Storage 20a to be inspected in the inspection position by part detector 50 is positioned adjacently directly under light receiver 40. Accordingly, the transmitted light which is emitted from light emitter 34 (FIGS. 6A and 6B) and has passed through storage 20a and feed hole 20b can be stably received by light receiving sensors 39A and 39B. Accordingly, the presence or absence of part P in storage 20a and the position detection of feed hole 20b can be accurately performed.

Next, an example of a part detection targeting of part feeding tape 11A which stores part P in the embossed portion and which has a large thickness will be described by reference FIGS. 8A and 8B. As shown by the cross-section in FIG. 8B, part feeding tape 11A has a configuration that cover tape 21 is adhered on the upper surface of storage 20a in which embossed portion 20AE and feed hole 20b projecting to the lower surface side are formed, and large-sized part P is stored in storage 20a.

Figure 8A:
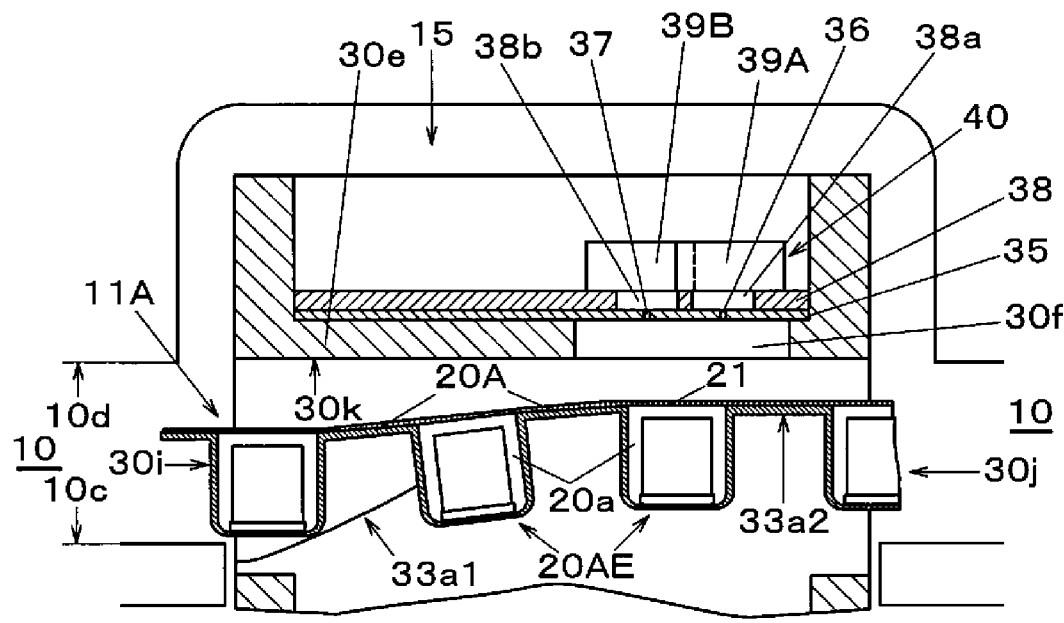
FIG. 8A is an explanatory view of part detection targeting of an emboss-type part feeding tape by the part detecting sensor to be used in the part feeding device according to the exemplary embodiment of the present disclosure.
Figure 8B:
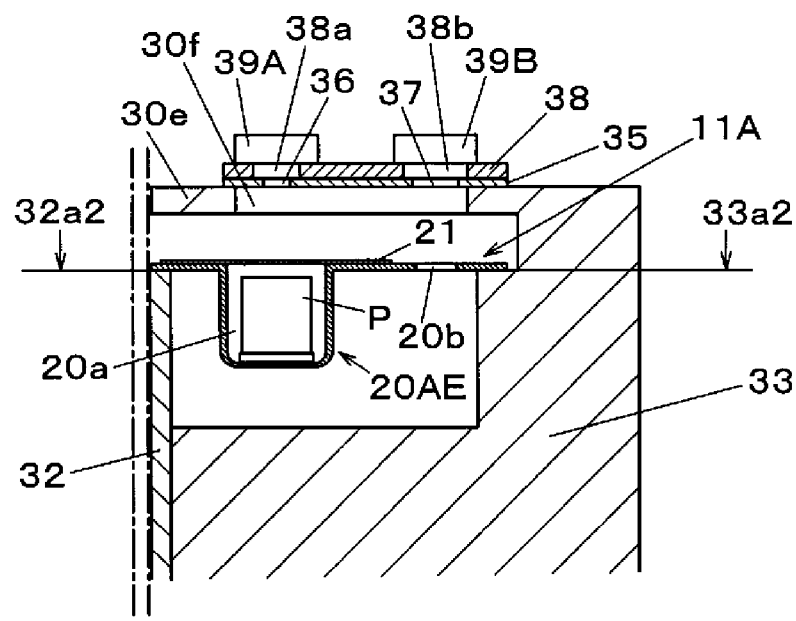
FIG. 8B is an explanatory view of part detection targeting of the emboss-type part feeding tape by the part detecting sensor to be used in the part feeding device according to the exemplary embodiment of the present disclosure.

As shown in FIG. 8A, part feeding tape 11A, which is transported in a state where embossed portion 20AE is transported along guide surface 10c of transporting passage 10 at the upstream side, enters into part detecting sensor 15 from inlet 30i, and as shown in FIG. 8B, the part feeding tape 11A is transported in a state where the lower surface of the both side portions is supported by slope guide surfaces 32a1 and 33a1 and horizontal guide surfaces 32a2 and 32a2. In this case, embossed portion 20AE is raised from guide surface 10c and passes through a space which is pinched between partial guide surface 32a and partial guide surface 33a. When storage 20a to be inspected is reached to an inspection position by part detector 50 (FIG. 6A), the light that has passed through embossed portion 20AE and storage 20a and is emitted from light emitter 34 is received by light receiving sensor 39A via slit 36 to detect the presence or absence part P in storage 20a within embossed portion 20AE.

Therefore, even in a case where an embossed type tape having a large thickness such as part feeding tape 11A is set as a target, part feeding tape 11A guided into part detecting sensor 15 is transported such the slope guide surfaces 33a1 and 33a2 in a form having the above-described approach portion support the lower surface of the both sides end portion. Storage 20a within embossed portion 20AE to be inspected in the inspection position by part detector 50 is positioned adjacently directly under light receiver 40. Accordingly, the transmitted light which is emitted from light emitter 34 (FIG. 6A) and has passed through embossed portion 20AE, storage 20a, and feed hole 20b can be stably received by light receiving sensors 39A and 39B. Accordingly, the presence or absence of part P in storage 20a of embossed portion 20AE to be inspected and the position detection of feed hole 20b can be accurately performed.

In the present exemplary embodiment in this way, in a configuration in which part P stored in storage 20a is optically detected by part detector 50 disposed on transporting passage 10, a form, in which, on transporting passages 10, at the upstream portion of part detector 50 where at least part detector 50 is provided, guide surface 10c for guiding the lower surface of part feeding tape 11 or part feeding tape 11A and ceiling surface 10d which faces guide surface 10c and is positioned at a position upwardly apart from guide surface 10c by the dimension larger than the thickness of part feeding tape having a maximum thickness used from guide surface 10c to tape feeder 5 are provided, is adopted. The part feeding tape having a maximum thickness can be set as a detecting target.

Furthermore, a form having partial guide surfaces 32a and 33a supporting the lower surface of at least side portion of part feeding tape 11 and part feeding tape 11A at the upstream side than the detection position of the part by part detector 50, is used. A configuration in which slope guide surfaces 32a1 and 33a1 approaching ceiling surface 30k toward downstream is provided at least one of positions of partial guide surfaces 32a and 33a is used. Therefore, in a case where a thin type of the part feeding tape such as a paper tape for a small-sized part is set as a target, slope guide surfaces 32a1 and 33a1 allow the part feeding tape to being approached light receiver 40 of part detector 50.

By adopting such a configuration, even in a case where a plurality of the part feeding tapes having the different thicknesses such as a paper tape for a small-sized part (refer to part feeding tape 11) or an embossed tape for a large-sized part (refer to part feeding tape 11A) is set as the detecting target, the presence or absence of part P in storage 20a can be stably detected, regardless of the type or the thickness of the part to be fed, the type of part feeding tape which stores the part, and difference in the thicknesses of the tapes.

Figure 9:
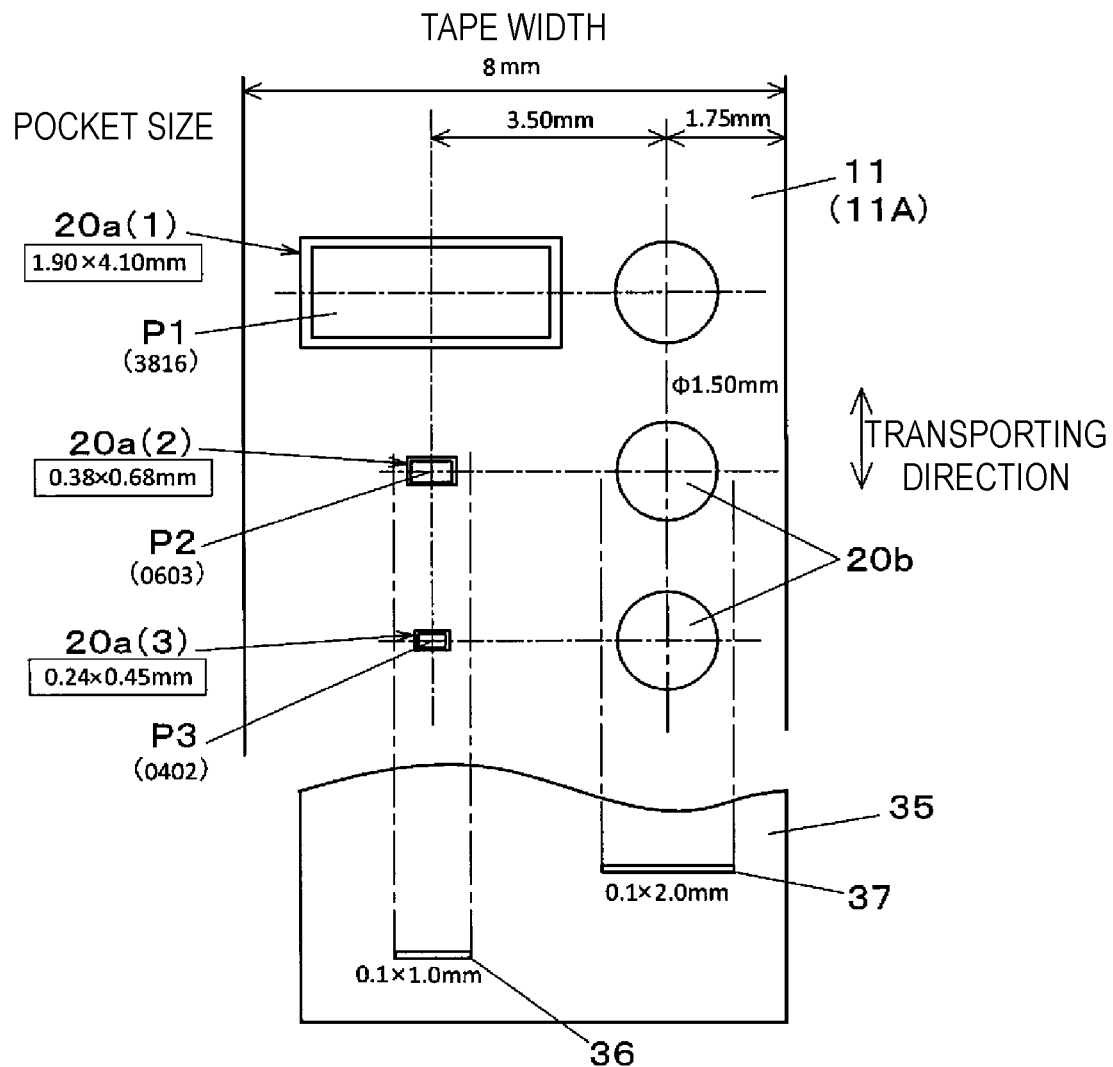
FIG. 9 is an explanatory view illustrating a relationship between an opening of a shielding member and the part feeding tape to be detected by the part detecting sensor to be used in the part feeding device according to the exemplary embodiment of the present disclosure.

Next, a relationship between part feeding tape 11 (11A) to be detected by part detecting sensor 15 and an opening of shielding member 35 will be described by reference FIG. 9. FIG. 9 schematically illustrates shapes, sizes, and positions of storage 20a and feed hole 20b to be form in part feeding tape 11 (part feeding tape 11A) having a standard-width (8 mm) that is targeted by tape feeder 5 shown in the present exemplary embodiment. Here, regarding a plurality types (here, three types) of parts P to be fed by part feeding tape 11 (part feeding tape 11A), each nominal size and plane dimension (pocket size) of storage 20a targeting of the part are shown.

That is, part P is in a rectangular shape where a dimension of part feeding tape 11 in a transporting direction is W1 and a dimension of part feeding tape 11 in a width direction W2. For example, nominal sized (3816) part P1 (W1=1.6 mm, W2=3.8 mm) corresponds to pocket sized (1.90×4.10 mm) storage 20a (1). In addition, normal sized (0603) part P2 (W1=0.3 mm, W2=0.6 mm) corresponds to pocket sized (0.38×0.68 mm) storage 20a (2). Normal sized (0402) part P3 (W1=0.2 mm, W2=0.4 mm) corresponds to pocket sized (0.24×0.45 mm) storage 20a (3). Feed hole 20b is provided in a size of Φ1.50 mm diameter and at a position 1.75 mm from the side end surface of part feeding tape 11.

Shielding member 35 is disposed between light emitter 34 and part feeding tape 11 (11A). In this state, shielding member 35 is formed in a position that overlaps the position that has passed through storage 20a of part feeding tape 11 (refer to FIG. 4). Slits 36 and 37 as an opening for passing the light that has passed through part feeding tape 11 from light emitter 34 are provided in shielding member 35. Slit 37 is an opening for detecting feed hole 20b, and is formed in a position that overlaps feed hole 20b in 0.1×2.0 mm of a slit size.

Slit 36 is an opening for detecting storage 20a, and is formed in a rectangular shape where the dimension of part feeding tape 11 in the transporting direction is D1 and the dimension of part feeding tape 11 in the width direction is D2. In the present exemplary embodiment, as a shape of slit 36 that is an opening for part detecting provided in shielding member 35, a long and narrow rectangular slit in which dimension D1 in the transporting direction is narrower than dimension D2 of part feeding tape 11 in the width direction is used.

The shape of slit 36 will be described in more detail. Dimension D1 (0.1 mm) of slit 36 in the transporting direction is set as a dimension narrower than dimension W1 (0.2 mm) of part feeding tape 11 of the part (here, nominal sized (0402) part P3) having a minimum size to be fed by part feeding tape 11 having a width of 8 mm, in a width direction.

Dimension D2 of part feeding tape 11 of slit 36 in the width direction is set as a dimension larger than dimension W2 (0.4 mm) of part feeding tape 11 of a part (here, nominal sized (0402) part P3) having a minimum size to be fed by part feeding tape 11 in the width direction. Specifically, dimension D2, that is, a dimension of part feeding tape 11 of slit 36 in the width direction is preferably set as in a range of 0.6 mm to 2.0 mm inclusive. A support size of dimension D2 of slit 36 in the present example is 1.0 mm. Since the nominal size of the part having a minimum size to be fed by the part feeding tape having a width of 4 mm is 0201 (W1=0.2 mm, W2=0.1 mm), at the time of the filing of the present application, in the dimension of the slit used for the part feeding tape having a width of 4 mm, D1 is in a range of 0.05 mm to 0.08 mm inclusive, and D2 is in a range of 0.5 mm to 1.0 mm inclusive.

In part detector 50 provided in part detecting sensor 15 having the above-described configuration, the technical significance of setting the size of slit 36 formed on shielding member 35 as described above sill be explained below. In tape feeder 5 shown in the present exemplary embodiment, as a reel replacing method when supplying part feeding tape 11, when a shortage of a part occurs in the preceding part feeding tape (preceding tape), a method for adding and inserting the followed next part feeding tape (following tape), the so-called auto-loading method is used. In this method, newly fed part feeding tape 11 feeds the tape along transporting passage 10 by feeder 13, and feed hole 20b of part feeding tape 11 is engaged with the sprocket of conveyor 16.

However, in a case where, in such an auto-loading method, the presence or absence of the part in part feeding tape 11 is detected by part detecting sensor 15, inconveniences described below occur. That is, in the auto-loading method, following part feeding tape 11 only moves such that part feeding tape 11 is pushed and transmitted by feeder 13 from the upstream side, and part feeding tape 11 is not accurately positioned and held. Accordingly, the position or the posture of part feeding tape 11 reached in part detecting sensor 15 is not necessarily stable. Therefore, in part feeding tape 11, the positional relationship between storage 20a storing the part and part detector 50 is not suitable for part detecting, and the part detecting cannot be stably performed in some cases.

Even in such a case, by setting the size of slit 36 formed on shielding member 35 so as to satisfy the relationship as shown in FIG. 9, storage 20a can be positioned constantly so as to overlap the width range of slit 36 even in a state where the position of part feeding tape 11 in the width direction is unstable. Therefore, the detecting light for detecting the presence or absence of part P in storage 20a can reliably be passed through slit 36. Accordingly, part detecting can be stably performed.

Figure 10A:
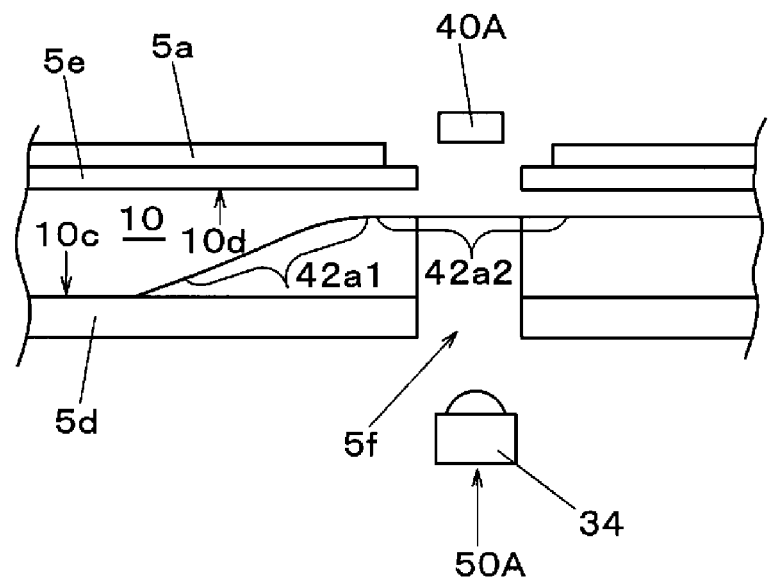
FIG. 10A is an explanatory view of another example of the part detecting sensor to be used in the part feeding device according to the exemplary embodiment of the present disclosure.
Figure 10B:
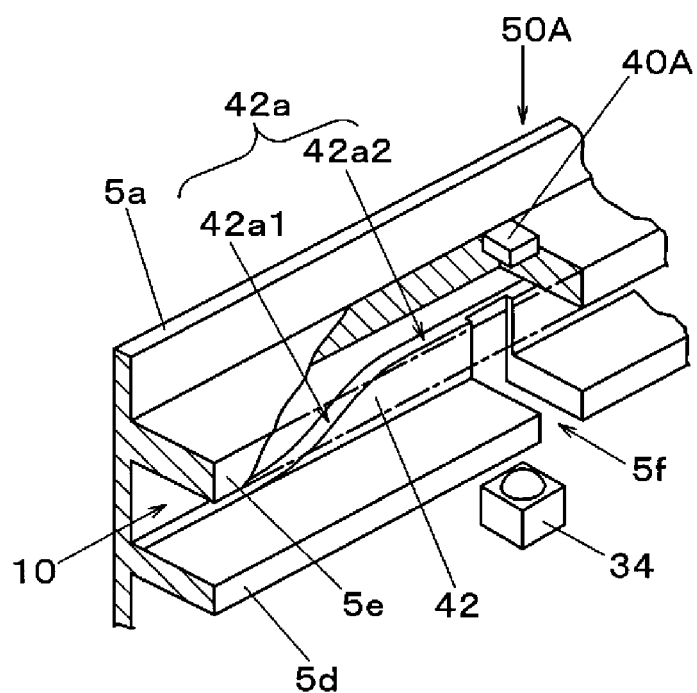
FIG. 10B is an explanatory view of another example of the part detecting sensor to be used in the part feeding device according to the exemplary embodiment of the present disclosure.

As part detecting sensor 15 in the present exemplary embodiment, a part detecting sensor having a simple configuration as shown in FIGS. 10A and 10B may be used instead of a single unit part detecting sensor. In FIGS. 10A and 10B, lower portion 5d and upper portion 5e, which extend in a horizontal direction and which are arranged up and down so as to face each other, are provided in main body portion 5a configures a frame of tape feeder 5. Transporting passage 10 for transporting part feeding tape 11 to be fed by main body portion 5a (refer to FIG. 11) or part feeding tape 11A is formed between lower portion 5d and upper portion 5e.

When transporting part feeding tape 11 or part feeding tape 11A on the upper surface of lower portion 5d, the bottom surface of upper portion 5e that is guide surface 10c guiding the lower surface of part feeding tape 11 is ceiling surface 10d which faces guide surface 10c and is positioned at a position upwardly apart from guide surface 10c by the dimension larger than the thickness of part feeding tape 11 having a maximum thickness to be fed by main body portion 5a from guide surface 10c. Guide surface 10c and ceiling surface 10d have the same function as that of guide surface 10c and ceiling surface 10d in transporting passage 10 shown in FIG. 6A.

On the upper surface of lower portion 5d, partial guide surface 42a formed of slope guide surface 42a1 and horizontal guide surface 42a2 is provided along the inner side surface of main body portion 5a. As the same manner of partial guide surface 32a in FIG. 6A, partial guide surface 42a has a function of guiding the lower surface of part feeding tape 11 or part feeding tape 11A. Partial guide surface 42a is formed by slope guide surface 42a1 gradually approaching ceiling surface 10d toward a downstream side from guide surface 10c and horizontal guide surface 42a2. In this example, partial guide surface 42a guides the side portion having a plurality of feed hole 20b among the both side portion of part feeding tape 11 or part feeding tape 11A.

Opening 5f made of cut away upper portion 5e and lower portion 5d is formed in the portion corresponding to horizontal guide surface 42a2. At the lower side of opening 5f, light emitter 34 having the same function as that of part detector 50 in FIG. 6A is disposed. At the upper side of opening 5f, light receiver 40A is disposed. Light emitter 34 and light receiver 40A constitute part detector 50A, and have the same function as that of part detector 50 in FIG. 6A. That is, the light, which is emitted from light emitter 34 and has passed through storage 20a of part feeding tape 11 or part feeding tape 11A, is received by light receiver 40A. Therefore, as the same manner as the examples shown in FIGS. 7A, 7B, 8A, and 8B, the presence or absence of part P to be detected in storage 20a is detected.

In the detailed exemplary embodiment of the present disclosure, the auto-loading type part feeding device is used as an example. The part feeding device other than the auto-loading type part feeding device, that is, a part feeding device without feeder 13 which transports part feeding tape 11 inserted from insertion port 10a of transporting passage 10 to conveyor 16 or tape standby operation mechanism 14 can also be applied to the exemplary embodiment.

As shown in FIGS. 2A, 2B, 6A, 6B, 11, and the like, tape feeder 5 (part feeding device) of the present disclosure is a part feeding device which transports part feeding tape 11 from an upstream side toward a downstream side, and transports part feeding tape 11 which stores part P in storage 20a to part removing position 12 to feed part P stored in storage 20a to part mounting apparatus 1. Tape feeder 5 includes main body portion 5a in which transporting passage 10 for guiding part feeding tape 11 to part removing position 12 is provided; conveyor 16 for transporting part feeding tape 11 in transporting passage 10 toward part removing position 12 to position storage 20a on part removing position 12; and part detector 50 for detecting part P stored in storage 20a in transporting passage 10 located upstream of part removing position 12. At a position further upstream than part detector 50, transporting passage 10 includes guide surface 10c for guiding the lower surface of part feeding tape 11, and ceiling surfaces 10d and 30k which face guide surface 10c and are positioned at a position upwardly apart from guide surface 10c by the dimension larger than the thickness of part feeding tape 11 having the maximum thickness to be used in tape feeder 5. Transporting passage 10 further includes partial guide surface 32a which supports the lower surface of at least one side portion of part feeding tape 11 at a position further upstream than the detection position of part P by part detector 50. Partial guide surface 32a includes an approaching portion approaching ceiling surface 30k in a downstream direction.

As shown in FIGS. 1, 2A, 2B, 6A, 6B, 11, and the like, part mounting apparatus 1 of the present disclosure is a part mounting apparatus which transports transporting part feeding tape 11 from an upstream side toward a downstream side, transports part feeding tape 11 which stores part P in storage 20a to part removing position 12, and removes part P from storage 20a positioned on part removing position 12 to mount the removed part on substrate 3. Part mounting apparatus 1 includes main body portion 5a, in which transporting passage 10 for guiding part feeding tape 11 to part removing position 12, is provided; conveyor 16 for transporting part feeding tape 11 in transporting passage 10 toward part removing position 12 to position storage 20a to part removing position 12; part detector 50 for detecting part P stored in storage 20a in transporting passage 10 at a position further upstream than part removing position 12; and mounting head 9 for mounting part P, which is removed from storage 20a that is positioned on part removing position 12, on substrate 3. At a position further upstream than part detector 50, transporting passage 10 at a position further upstream than part detector 50, transporting passage 10 includes guide surface 10c for guiding the lower surface of part feeding tape 11, and ceiling surfaces 10d and 30k which face guide surface 10c and are positioned at a position upwardly apart from guide surface 10c by the dimension larger than the thickness of part feeding tape 11 having the maximum thickness to be used in part mounting apparatus 1. Transporting passage 10 further includes partial guide surface 32a which supports the lower surface of at least one side portion of part feeding tape 11 at a position further upstream than the detection position of part P by part detector 50. Partial guide surface 32a includes an approaching portion approaching ceiling surface 30k in a downstream direction.

In addition, as shown in FIGS. 2A, 2B, 6A, 6B, 11, and the like, another tape feeder 5 (part feeding device) of the present disclosure is a part feeding device which transports part feeding tape 11 from an upstream side toward a downstream side, and transports part feeding tape 11 which stores part P in storage 20a to part removing position 12 to feed part P stored in storage 20a to part mounting apparatus 1. The tape feeder 5 includes part detecting sensor 15 having main body portion 5a in which transporting passage 10 for guiding part feeding tape 11 to part removing position 12 is provided, conveyor 16 for transporting part feeding tape 11 in transporting passage 10 toward part removing position 12 to position storage 20a on part removing position 12, and part detector 50 for detecting part P stored in storage 20a in transporting passage 10 a position further upstream than part removing position 12. At a position further upstream than part detector 50, transporting passage 10 includes guide surface 10c for guiding the lower surface of part feeding tape 11, and ceiling surfaces 10d and 30k which face guide surface 10c and are positioned at a position upwardly apart from guide surface 10c by the dimension larger than the thickness of part feeding tape 11 having the maximum thickness to be used in tape feeder 5. Part detecting sensor 15 configures a part of transporting passage 10, and includes passage R which is provided with an inlet at a position further upstream than transporting passage 10 and a outlet at a position further downstream than transporting passage 10, upper portion 30e which configures a ceiling of passage R, and partial guide surface 32a which supports the lower surface of at least one side portion of part feeding tape 11 in passage R. Partial guide surface 32a includes an approaching portion approaching upper portion 30e in a downstream direction.

As shown in FIGS. 1, 2A, 2B, 6A, 6B, 11, and the like, another part mounting apparatus 1 of the present disclosure is a part mounting apparatus which transports transporting part feeding tape 11 from an upstream side toward a downstream side, transports part feeding tape 11 which stores part P in storage 20a to part removing position 12, and removes part P from storage 20a positioned on part removing position 12 to mount the removed part on substrate 3. Part mounting apparatus 1 includes main body portion 5a in which transporting passage 10 for guiding part feeding tape 11 to part removing position 12 is provided; conveyor 16 for transporting part feeding tape 11 in transporting passage 10 toward part removing position 12 to position storage 20a to part removing position 12; part detecting sensor 15 having part detector 50 for detecting part P stored in storage 20a in transporting passage 10 at a position further upstream than part removing position 12; and mounting head 9 for mounting part P, which is removed from storage 20a that is positioned on part removing position 12, on substrate 3. At a position further upstream than detector 50, transporting passage 10 includes guide surface 10c for guiding the lower surface of part feeding tape 11, and ceiling surfaces 10d and 30k which face guide surface 10c and are positioned at a position upwardly apart from guide surface 10c by the dimension larger than the thickness of part feeding tape 11 having the maximum thickness to be used in part mounting apparatus 1. Part detecting sensor 15 configures a part of transporting passage 10, and includes passage R which is provided with an inlet at a position further upstream than transporting passage 10 and a outlet at a position further downstream than transporting passage 10, upper portion 30e which configures a ceiling of passage R, and partial guide surface 32a which supports the lower surface of at least one side portion of part feeding tape 11 in passage R. Partial guide surface 32a includes an approaching portion approaching upper portion 30e in a downstream direction.

In addition, in the above-described tape feeder 5 (part feeding device) and part mounting apparatus 1, part feeding tape 11 has a plurality of feed holes 20b (feed opening), and the plurality of feed holes 20b are formed at a constant pitch. It is more preferable that partial guide surface 32a guides a side portion having a plurality of feed holes 20b.

Furthermore, in the above-described tape feeder 5 (part feeding device) and part mounting apparatus 1, it is more preferable that the approaching portion includes a slope.

In addition, in the above-described tape feeder 5 (part feeding device) and part mounting apparatus 1, it is more preferable that part detector 50 detects part P stored in storage 20a of part feeding tape 11 which passes through the approaching portion and approaches ceiling surface 30k (or upper portion 30e).

In addition, the above-described tape feeder 5 (part feeding device) and part mounting apparatus 1, it is more preferable that part detector 50 includes a magnetic sensor for detecting changes in a magnetic field, or an optical sensor for receiving, by light receiving sensors 39A and 39B (light receiver), light from light emitter 34 that has passed through part feeding tape 11 or reflected light from part P radiated from a projector, and the magnetic sensor or light receiving sensors 39A and 39B (light receiver) are disposed on ceiling surface 30k side of transporting passage R.

The part feeding device and part mounting apparatus of the present disclosure have an effect capable of stably detecting the presence or absence of the part in the storage and are effective to a part mounting field that the part stored in the part feeding tape is removed and mounted on the substrate.

What is claimed is:

1. A part feeding device which transports a part feeding tape from an upstream side toward a downstream side, and transports the part feeding tape which stores a part in a storage to a part removing position to feed the part stored in the storage to a part mounting apparatus, the part feeding device comprising:

a main body in which a transporting passage for guiding the part feeding tape to the part removing position is provided;
a conveyor for transporting the part feeding tape in the transporting passage toward the part removing position to position the storage on the part removing position; and
a part detector for detecting the part stored in the storage in the transporting passage located upstream of the part removing position,
wherein, at a position further upstream than the part detector, the transporting passage includes
a guide surface for guiding a lower surface of the part feeding tape;
a ceiling surface which faces the guide surface and is positioned at a position upwardly apart from the guide surface by a dimension larger than a thickness of the part feeding tape having a maximum thickness to be used in the part feeding device; and
a partial guide surface which supports a lower surface of at least one side portion other than a central portion of the part feeding tape under the ceiling surface of the part detector, and
the partial guide surface includes an approaching portion approaching the ceiling surface in a downstream direction, and a distance between the approaching portion of the partial guide surface and the ceiling surface is decreased from the upstream side toward the downstream side.

2. The part feeding device of claim 1,
wherein the part feeding tape has a plurality of feed openings,
the plurality of feed openings are formed at a constant pitch, and
the partial guide surface guides a side portion having the plurality of feed openings.

3. The part feeding device of claim 1,
wherein the approaching portion includes a slope.

4. The part feeding device of claim 1,
wherein the part detector detects the part stored in the storage of the part feeding tape which passes through the approaching portion and approaches the ceiling surface.

5. The part feeding device of claim 4,
wherein the part detector includes
a magnetic sensor for detecting changes in a magnetic field or
an optical sensor for receiving, by a light receiver, light that is emitted from a light emitter and that has passed through the part feeding tape or light that is radiated from a projector, and reflected from the part, and
the magnetic sensor or the light receiver is disposed on the ceiling surface side of the transporting passage.

6. A part mounting apparatus which transports a part feeding tape from an upstream side toward a downstream side, transports the part feeding tape which stores a part in a storage to a part removing position, and removes the part from the storage positioned on the part removing position to mount the removed part on a substrate, the part mounting apparatus comprising:
a main body portion in which a transporting passage for guiding the part feeding tape to the part removing position is provided;
a conveyor for transporting the part feeding tape in the transporting passage toward the part removing position to position the storage to the part removing position;
a part detector for detecting the part stored in the storage in transporting passage at a position further upstream than the part removing position; and
a mounting head for mounting the part, which is removed from the storage that is positioned on the part removing position, on the substrate,
wherein, at a position further upstream than the part detector, the transporting passage includes
a guide surface for guiding a lower surface of the part feeding tape;
a ceiling surface which faces the guide surface and is positioned at a position upwardly apart from the guide surface by a dimension larger than a thickness of the part feeding tape having a maximum thickness to be used in the part mounting apparatus; and
a partial guide surface which supports a lower surface of at least one side portion other than a central portion of the part feeding tape at under the ceiling surface of the part detector, and
the partial guide surface includes an approaching portion approaching the ceiling surface in a downstream direction, and a distance between the approaching portion of the partial guide surface and the ceiling surface is decreased from the upstream side toward the downstream side.

7. The part mounting apparatus of claim 6,
wherein the part feeding tape has a plurality of feed openings,
the plurality of feed openings are formed at a constant pitch, and
the partial guide surface guides a side portion having the plurality of feed openings.

8. The part mounting apparatus of claim 6,
wherein the approaching portion includes a slope.

9. The part mounting apparatus of claim 6,
wherein the part detector detects the part stored in the storage of the part feeding tape which passes through the approaching portion and approaches the ceiling surface.

10. The part mounting apparatus of claim 9,
wherein the part detector includes
a magnetic sensor for detecting, by a light receiver, changes in a magnetic field or
an optical sensor for receiving light that is emitted from a light emitter and that has passed through the part feeding tape or light that is radiated from a projector and reflected from the part, and
the magnetic sensor or the light receiver is disposed on the ceiling surface side of the transporting passage.

11. A part feeding device which transports a part feeding tape from an upstream side toward a downstream side, and transports the part feeding tape which stores a part in a storage to a part removing position to feed the part stored in the storage to a part mounting apparatus, the part feeding device comprising:
a part detecting sensor having
a main body portion in which a transporting passage for guiding the part feeding tape to the part removing position is provided,
a conveyor for transporting the part feeding tape in the transporting passage toward the part removing position to position the storage on the part removing position, and
a part detector for detecting the part stored in the storage in the transporting passage at a position further upstream than the part removing position, wherein, at a position further upstream than the part detector, the transporting passage includes
  a guide surface for guiding a lower surface of the part feeding tape, and
  a ceiling surface which faces the guide surface and is positioned at a position upwardly apart from the guide surface by a dimension larger than a thickness of the part feeding tape having a maximum thickness to be used in the part feeding device,
the part detecting sensor
  configures a part of the transporting passage, and
  includes a passage which is provided with an inlet at a position further upstream than the transporting passage and an outlet at a position further downstream than the transporting passage,
  an upper portion which configures a ceiling of the passage, and
  a partial guide surface which supports a lower surface of at least one side portion other than a central portion of the part feeding tape in the passage, and
the partial guide surface includes an approaching portion approaching the upper portion in a downstream direction, and a distance between the approaching portion of the partial guide surface and the ceiling surface is decreased from the upstream side toward the downstream side.

12. The part feeding device of claim 11,
wherein the part feeding tape has a plurality of feed openings,
the plurality of feed openings are formed at a constant pitch, and
the partial guide surface guides a side portion having the plurality of feed openings.

13. The part feeding device of claim 11,
wherein the approaching portion includes a slope.

14. The part feeding device of claim 11,
wherein the part detector detects the part stored in the storage of the part feeding tape which passes through the approaching portion and approaches the upper portion.

15. The part feeding device of claim 14,
wherein the part detector includes
  a magnetic sensor for detecting changes in a magnetic field or
  an optical sensor for receiving, by a light receiver, light that is emitted from a light emitter and that has passed through the part feeding tape or light that is radiated from a projector and reflected from the part, and
the magnetic sensor or the light receiver is disposed on the ceiling surface side of the transporting passage.

16. A part mounting apparatus which transports a part feeding tape from an upstream side toward a downstream side, transports the part feeding tape which stores a part in a storage to a part removing position, and removes the part from the storage positioned on the part removing position to mount the removed part on a substrate, the part mounting apparatus comprising:
  a main body portion in which a transporting passage for guiding the part feeding tape to the part removing position is provided;
  a conveyor for transporting the part feeding tape in the transporting passage toward the part removing position to position the storage to the part removing position;
  a part detecting sensor having a part detector for detecting the part stored in the storage in the transporting passage at a position further upstream than the part removing position; and
  a mounting head for mounting the part, which is removed from the storage that is positioned on the part removing position, on the substrate,
wherein, at a position further upstream than the part detector, the transporting passage includes
  a guide surface for guiding a lower surface of the part feeding tape, and
  a ceiling surface which faces the guide surface and is positioned at a position upwardly apart from the guide surface by a dimension larger than a thickness of the part feeding tape having a maximum thickness to be used in the part mounting apparatus,
the part detecting sensor
  configures a part of the transporting passage, and
  includes a passage which is provided with an inlet at a portion further upstream than the transporting passage and an outlet at a position further downstream than the transporting passage,
  an upper portion which configures a ceiling of the passage, and
  a partial guide surface which supports a lower surface of at least one side portion other than a central portion of the part feeding tape in the passage, and
the partial guide surface includes an approaching portion approaching the upper portion in a downstream direction, and a distance between the approaching portion of the partial guide surface and the ceiling surface is decreased from the upstream side toward the downstream side.

17. The part mounting apparatus of claim 16,
wherein the part feeding tape has a plurality of feed openings,
the plurality of feed openings are formed at a constant pitch, and
the partial guide surface guides a side portion having the plurality of feed openings.

18. The part mounting apparatus of claim 16,
wherein the approaching portion includes a slope.

19. The part mounting apparatus of claim 16,
wherein the part detector detects the part stored in the storage of the part feeding tape which passes through the approaching portion and approaches the upper portion.

20. The part mounting apparatus of claim 19,
wherein the part detector includes
  a magnetic sensor for detecting, by a light receiver, changes in a magnetic field or
  an optical sensor for receiving light that is emitted from a light emitter and that has passed through the part feeding tape or light that is radiated from a projector, and reflected from the part, and
the magnetic sensor or the light receiver is disposed on the ceiling surface side of the transporting passage.

21. The part feeding device of claim 1,
wherein the approaching portion starts at the point where the transporting passage enters into the part detector and ends at a detection position of the detector.

22. The part mounting apparatus of claim 6,
wherein the approaching portion starts at the point where the transporting passage enters into the part detector and ends at a detection position of the detector.

23. The part feeding device of claim 11,
wherein the approaching portion starts at the point where the transporting passage enters into the part detecting sensor and ends at a detection position of the detector.

24. The part mounting apparatus of claim 16,
wherein the approaching portion starts at the point where the transporting passage enters into the part detecting sensor and ends at a detection position of the detector.

\* \* \* \* \*